United States Patent
Ikeda et al.

(10) Patent No.: US 9,728,737 B2
(45) Date of Patent: Aug. 8, 2017

(54) LIGHT-EMITTING DEVICE, LIGHTING DEVICE, AND MANUFACTURING METHOD OF LIGHT-EMITTING DEVICE

(71) Applicant: Semiconductor Energy Laboratory Co., Ltd., Kanagawa-ken (JP)

(72) Inventors: Hisao Ikeda, Kanagawa (JP); Kohei Yokoyama, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/297,004

(22) Filed: Jun. 5, 2014

(65) Prior Publication Data

US 2014/0284587 A1    Sep. 25, 2014

Related U.S. Application Data

(63) Continuation of application No. 13/187,688, filed on Jul. 21, 2011, now Pat. No. 8,748,930.

(30) Foreign Application Priority Data

Jul. 26, 2010    (JP) ................................ 2010-167282

(51) Int. Cl.
*H01L 51/52*    (2006.01)
*H01L 51/50*    (2006.01)
(Continued)

(52) U.S. Cl.
CPC ...... *H01L 51/5203* (2013.01); *H01L 51/5212* (2013.01); *H01L 51/5228* (2013.01);
(Continued)

(58) Field of Classification Search
CPC .................. H01L 51/5203; H01L 51/5212
(Continued)

(56) References Cited

U.S. PATENT DOCUMENTS

| 5,369,289 A | 11/1994 | Tamaki et al. |
| 5,421,908 A | 6/1995 | Yoshida et al. |

(Continued)

FOREIGN PATENT DOCUMENTS

| CN | 001610472 A | 4/2005 |
| CN | 100474652 C | 4/2009 |

(Continued)

OTHER PUBLICATIONS

Taiwanese Office Action re Application No. TW 100125307, dated Dec. 4, 2015.
(Continued)

*Primary Examiner* — Moazzam Hossain
(74) *Attorney, Agent, or Firm* — Husch Blackwell LLP

(57) ABSTRACT

The manufacturing method of the light-emitting device is provided in which an auxiliary electrode in contact with an electrode formed using a transparent conductive film of a light-emitting element is formed using a mask, and direct contact between the auxiliary electrode and an EL layer is prevented by oxidizing the auxiliary electrode. Further, the light-emitting device manufactured according to the method and the lighting device including the light-emitting device are provided.

7 Claims, 6 Drawing Sheets

(51) Int. Cl.
*H01L 33/36* (2010.01)
*H01L 33/18* (2010.01)
*H05B 33/22* (2006.01)
*H05B 33/26* (2006.01)

(52) U.S. Cl.
CPC ............ *H05B 33/22* (2013.01); *H05B 33/26* (2013.01); *H01L 2251/5361* (2013.01)

(58) Field of Classification Search
USPC ...................................................... 257/98, 99
See application file for complete search history.

(56) References Cited

U.S. PATENT DOCUMENTS

| | | | |
|---|---|---|---|
| 5,905,275 | A | 5/1999 | Nunoue et al. |
| 6,157,127 | A | 12/2000 | Hosokawa et al. |
| 6,208,791 | B1 | 3/2001 | Bischel et al. |
| 6,320,312 | B1* | 11/2001 | Kim ................. H01L 27/3281 313/500 |
| 6,320,633 | B1 | 11/2001 | Broer et al. |
| 6,479,941 | B1 | 11/2002 | Abe et al. |
| 6,515,417 | B1 | 2/2003 | Duggal et al. |
| 6,525,467 | B1 | 2/2003 | Eida et al. |
| 6,538,374 | B2 | 3/2003 | Hosokawa |
| 6,566,808 | B1 | 5/2003 | Duggal et al. |
| 6,593,691 | B2 | 7/2003 | Nishi et al. |
| 6,608,449 | B2 | 8/2003 | Fukunaga |
| 6,630,785 | B1 | 10/2003 | Lu |
| 6,661,029 | B1 | 12/2003 | Duggal |
| 6,700,322 | B1 | 3/2004 | Duggal et al. |
| 6,777,871 | B2 | 8/2004 | Duggal et al. |
| 6,781,162 | B2 | 8/2004 | Yamazaki et al. |
| 6,800,999 | B1 | 10/2004 | Duggal et al. |
| 6,825,496 | B2 | 11/2004 | Yamazaki et al. |
| 6,841,949 | B2 | 1/2005 | Duggal |
| 6,853,011 | B2 | 2/2005 | Lin |
| 6,885,030 | B2 | 4/2005 | Onozuka et al. |
| 7,161,184 | B2 | 1/2007 | Miyagi et al. |
| 7,170,224 | B2 | 1/2007 | Lee et al. |
| 7,187,122 | B2 | 3/2007 | Kim |
| 7,192,804 | B2* | 3/2007 | Seo ................. H01L 21/6835 257/E21.599 |
| 7,198,533 | B2 | 4/2007 | Duggal et al. |
| 7,211,947 | B2 | 5/2007 | Kim |
| 7,221,095 | B2 | 5/2007 | Yamazaki et al. |
| 7,242,024 | B2 | 7/2007 | Yamazaki et al. |
| 7,528,418 | B2 | 5/2009 | Yamazaki et al. |
| 7,576,496 | B2 | 8/2009 | Duggal et al. |
| 7,728,325 | B2 | 6/2010 | Jung et al. |
| 7,733,441 | B2 | 6/2010 | Seo et al. |
| 7,755,280 | B2 | 7/2010 | Kim |
| 7,768,210 | B2 | 8/2010 | Shiang et al. |
| 7,808,002 | B2 | 10/2010 | Yamazaki et al. |
| 7,876,040 | B2 | 1/2011 | Kim |
| 8,344,620 | B2 | 1/2013 | Kim |
| 8,439,718 | B2 | 5/2013 | Kim |
| 8,648,382 | B2 | 2/2014 | Miyai et al. |
| 8,927,325 | B2 | 1/2015 | Gaerditz et al. |
| 9,076,981 | B2 | 7/2015 | Miyai et al. |
| 2001/0035393 | A1 | 11/2001 | Lu et al. |
| 2002/0190661 | A1 | 12/2002 | Duggal et al. |
| 2003/0127967 | A1 | 7/2003 | Tsutsui et al. |
| 2003/0189401 | A1 | 10/2003 | Kido et al. |
| 2003/0222575 | A1 | 12/2003 | Yamazaki et al. |
| 2003/0224571 | A1 | 12/2003 | Iijima et al. |
| 2004/0027059 | A1 | 2/2004 | Tsutsui |
| 2004/0032202 | A1 | 2/2004 | Fukunaga |
| 2004/0232830 | A1 | 11/2004 | Hieda |
| 2005/0073247 | A1 | 4/2005 | Yamazaki et al. |
| 2005/0162071 | A1* | 7/2005 | Lee ................. H01L 51/442 313/503 |
| 2005/0258436 | A1 | 11/2005 | Arai |
| 2006/0097627 | A1 | 5/2006 | Perlo et al. |
| 2006/0119258 | A1 | 6/2006 | Sakata et al. |
| 2007/0138944 | A1 | 6/2007 | Kim |
| 2007/0212896 | A1 | 9/2007 | Olsen et al. |
| 2008/0088227 | A1* | 4/2008 | Lee ................. H01L 51/5203 313/504 |
| 2010/0006882 | A1 | 1/2010 | Arai |
| 2010/0025716 | A1 | 2/2010 | Seo et al. |
| 2010/0026179 | A1 | 2/2010 | Seo et al. |
| 2010/0096981 | A1 | 4/2010 | Seo et al. |
| 2010/0176378 | A1* | 7/2010 | Lee ................. H01L 51/5088 257/40 |
| 2011/0186905 | A1 | 8/2011 | Schwab et al. |
| 2011/0284913 | A1 | 11/2011 | Ibe et al. |
| 2012/0007134 | A1* | 1/2012 | Miyai ................ H01L 51/5203 257/99 |

FOREIGN PATENT DOCUMENTS

| | | |
|---|---|---|
| EP | 1 111 966 A2 | 6/2001 |
| EP | 1 120 838 A2 | 8/2001 |
| EP | 1 399 003 A1 | 3/2004 |
| EP | 1 480 280 A2 | 11/2004 |
| EP | 1 492 388 A2 | 12/2004 |
| EP | 1 655 785 A1 | 5/2006 |
| EP | 1 914 816 A2 | 4/2008 |
| EP | 2 403 317 A1 | 1/2012 |
| JP | 62-272499 A | 11/1987 |
| JP | 63-141293 A | 6/1988 |
| JP | 01-134895 A | 5/1989 |
| JP | 06-223971 A | 8/1994 |
| JP | 11-097183 A | 4/1999 |
| JP | 2000-294371 A | 10/2000 |
| JP | 2001-015268 A | 1/2001 |
| JP | 2002-156633 A | 5/2002 |
| JP | 2004-014128 A | 1/2004 |
| JP | 2004-103582 A | 4/2004 |
| JP | 2004-134282 A | 4/2004 |
| JP | 2004-349138 A | 12/2004 |
| JP | 2006-140478 A | 6/2006 |
| JP | 2008-103305 A | 5/2008 |
| JP | 2008-243451 A | 10/2008 |
| JP | 2009-140817 A | 6/2009 |
| JP | 2010-116552 A | 5/2010 |
| JP | 2010-198980 A | 9/2010 |
| JP | 2012-502411 | 1/2012 |
| KR | 2004-0101071 A | 12/2004 |
| TW | 201018308 | 5/2010 |
| WO | WO 2008/062645 A1 | 5/2008 |
| WO | WO 2010/025696 A2 | 3/2010 |
| WO | WO 2010/038181 A1 | 4/2010 |

OTHER PUBLICATIONS

Taiwanese Office Action re Application No. TW 105120985, dated Oct. 25, 2016.
International Search Report re Application No. PCT/JP2011/066505, dated Aug. 30, 2011.
Written Opinion re Application No. PCT/JP2011/066505, dated Aug. 30, 2011.
"MEMS Thin Film Deposition Processes," http://www.memsnet.org/mems/processes/deposition.html, pp. 1-7.
"MEMS Thin Film Deposition Processes," http://www.memsnet.org/mems/processes/deposition.html, p. 7pages, MEMSnet.

* cited by examiner

FIG. 4A1
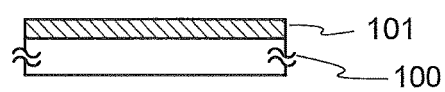
FIG. 4A2
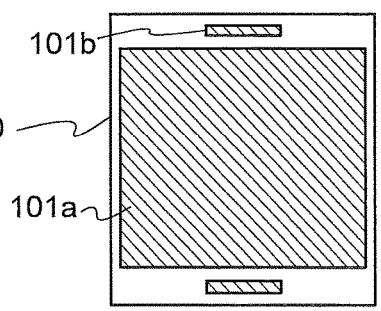
FIG. 4B
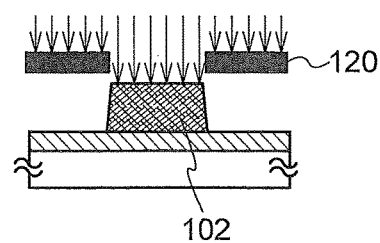
FIG. 4C1
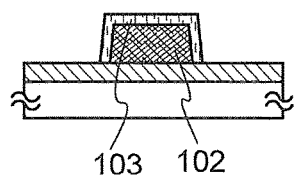
FIG. 4C2
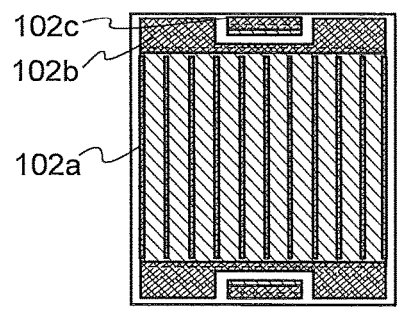
FIG. 4D1
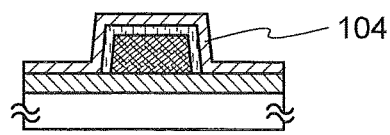
FIG. 4D2
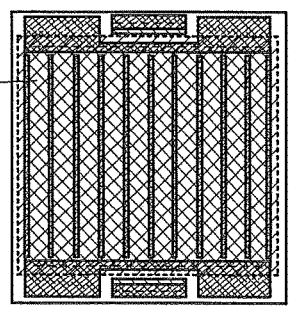
FIG. 4E1
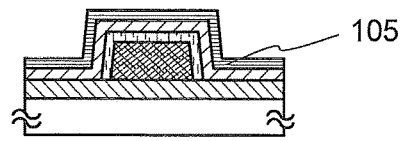
FIG. 4E2
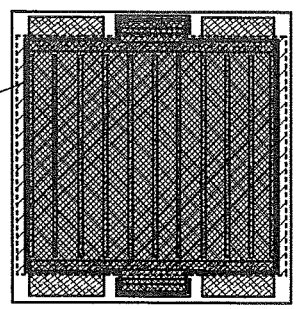

LIGHT-EMITTING DEVICE, LIGHTING DEVICE, AND MANUFACTURING METHOD OF LIGHT-EMITTING DEVICE

This application is a continuation of copending U.S. application Ser. No. 13/187,688 filed on Jul. 21, 2011 which is incorporated herein by reference.

TECHNICAL FIELD

The present invention relates to a light-emitting device including a light-emitting element in which a light-emitting layer containing an organic compound is interposed between a pair of electrodes, and a lighting device including the light-emitting device. The present invention also relates to a manufacturing method of the light-emitting device.

BACKGROUND ART

In recent years, a light-emitting element (also referred to as an electroluminescent (EL) element) in which a light-emitting layer (hereinafter also referred to as an EL layer) containing an organic compound is interposed between a pair of electrodes has been actively developed. Lighting has attracted attention as one of application fields of the light-emitting element. This is because a lighting device including the EL element has features different from those of other lighting devices; for example, the lighting device including the EL element can be thin and light, and perform surface emission.

As described above, an EL element has a structure in which a light-emitting layer containing an organic compound is interposed between a pair of electrodes. Thus, emission from the light-emitting layer is extracted through at least one of the pair of electrodes. Accordingly, in general, at least one of the pair of electrodes in the EL element is formed using a conductive film having a property of transmitting visible light (a transparent conductive film).

However, resistivity of a transparent conductive film is one or two orders of magnitude higher than that of metal which easily conducts electricity. In particular, in a large-area element that is used for a lighting purpose or the like, there is a problem in that change in luminance in a light-emitting region of the light-emitting element due to voltage drop is significant. Therefore, Patent Document 1 suggests that a metal layer formed using a substance whose resistance is lower than that of the transparent conductive film is provided between the transparent conductive film and the light-emitting layer containing an organic compound (see Patent Document 1).

There is another problem in that under the circumstances, the cost for manufacturing a lighting device including an EL element is very high. The high manufacturing cost results in a high price of the lighting device, which deteriorates the competitiveness of the lighting device including an EL element even though it has the above-described features different from those of other lighting devices. In order to spread the lighting device including an EL element, cost reduction in terms of both a material and a process is needed.

REFERENCE

[Patent Document 1] Japanese Published Patent Application No. 2009-140817

DISCLOSURE OF INVENTION

In the structure, as in Patent Document 1, in which a metal layer having high conductivity is provided as an auxiliary electrode to be in contact with a transparent conductive film in order to make up for low conductivity of the transparent conductive film, a step of forming a metal layer and a step of forming an insulating layer are additionally required. An insulating layer is provided in order that power loss due to emission at a portion overlapping with the auxiliary electrode is prevented because the emission at the portion overlapping with the auxiliary electrode cannot be extracted. However, to cover the metal layer accurately with the insulating layer, a plurality of masks which is densely aligned might need to be used, so that capital-investment spending for quantity production might be high.

In the case where the metal layer and the insulating layer are formed with the same mask, the insulating layer is formed only over an upper portion of the metal layer; thus, power loss due to emission at an end or a side surface of the metal layer cannot be prevented. Further, since a step exists in the end or the side-surface of the metal layer, when the coverage thereof with the EL layer is poor, short circuit between the transparent conductive film and the other electrode might be caused.

In view of the above, an object of one embodiment of the present invention is to provide a light-emitting device and a lighting device which have high reliability, small power loss, and uniform luminance in a light-emitting region and which can be manufactured at low cost.

An object of another embodiment of the present invention is to provide a manufacturing method of a light-emitting device by which an EL lighting device having high reliability, small power loss, and uniform luminance in a light-emitting region can be manufactured at low cost.

One embodiment of the present invention aims to achieve at least one of the above-described objects.

The present inventors have found that a light-emitting device manufactured in the following manner and a lighting device including the light-emitting device can solve the above-mentioned problems: an auxiliary electrode is formed in contact with an electrode formed using a transparent conductive film of a light-emitting element; and direct contact between the auxiliary electrode and an EL layer is prevented by oxidizing a surface of the auxiliary electrode. The auxiliary electrode can be formed using a shadow mask, so that a light-emitting device or a lighting device including the auxiliary electrode that is formed without photolithography and complicated steps such as etching can be manufactured. Further, an insulating film is formed by oxidizing the auxiliary electrode itself; thus, precise alignment for forming the insulating film is not needed and increase in capital-investment spending for a quantity production facility can be suppressed. Moreover, a surface of the auxiliary electrode except a surface being in contact with the transparent conductive film is covered with oxide, light emission at a portion overlapping with the auxiliary electrode or light emission at an end or a side surface of the auxiliary electrode can be suppressed, whereby the power loss is reduced. In addition, by providing the auxiliary electrode, a light-emitting device or a lighting device which has uniform luminance in a light-emitting region can be manufactured.

One embodiment of the present invention is a light-emitting device including a substrate having a light-transmitting property with respect to visible light; a first electrode and a second electrode over the substrate; an EL layer between the first electrode and the second electrode; an auxiliary electrode containing a metal between the first electrode and the EL layer; and an insulating layer formed by an oxide of the metal between the auxiliary electrode and the EL layer.

Another embodiment of the present invention is a light-emitting device having the above structure, in which the metal contained in the auxiliary electrode is an alkaline earth metal.

Another embodiment of the present invention is a light-emitting device having the above structure, in which the metal contained in the auxiliary electrode is aluminum.

Another embodiment of the present invention is a light-emitting device having the above structure, in which a layer in contact with the first electrode and the insulating layer and included in the EL layer is a layer including a composite material including a material having a hole-transport property and an acceptor substance.

Another embodiment of the present invention is a light-emitting device having the above structure, in which the auxiliary electrode is in the shape of a plurality of stripes.

Another embodiment of the present invention is a lighting device including the light-emitting device having the above structure.

Another embodiment of the present invention is a manufacturing method of a light-emitting device, including the steps of: forming a first electrode using a transparent conductive film over a substrate having a light-transmitting property with respect to visible light; forming an auxiliary electrode containing a metal over the first electrode by using a mask so as to be patterned; oxidizing the auxiliary electrode and forming an insulating layer by an oxide of the metal contained in the auxiliary electrode over a surface of the auxiliary electrode; forming an EL layer to cover the first electrode and the insulating layer; and forming a second electrode over the EL layer.

Another embodiment of the present invention is a manufacturing method of a light-emitting device according to the above method, in which the auxiliary electrode is oxidized by being exposed to oxygen plasma.

Another embodiment of the present invention is a manufacturing method of a light-emitting device according to the above method, in which the auxiliary electrode is formed using an alkaline earth metal.

Another embodiment of the present invention is a manufacturing method of a light-emitting device according to the above method, in which the auxiliary electrode is formed using aluminum.

Another embodiment of the present invention is a manufacturing method of a light-emitting device according to the above method, in which the auxiliary electrode is formed by a sputtering method or an evaporation method.

According to one embodiment of the present invention, a light-emitting device with high reliability, less power loss, and uniform illuminance in a light-emitting region, which can be manufactured inexpensively, can be provided.

Another embodiment of the present invention is a manufacturing method of a light-emitting device applicable to an EL lighting device with high reliability, less power loss, and uniform illuminance in a light-emitting region, which can be manufactured inexpensively.

BRIEF DESCRIPTION OF DRAWINGS

In the accompanying drawings:

FIGS. 4A1 to 4E2 are views illustrating a manufacturing method of a light-emitting device which is one embodiment of the present invention;

BEST MODE FOR CARRYING OUT THE INVENTION

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention is not construed as being limited to description of the embodiments.

Embodiment 1

Figure 1A:
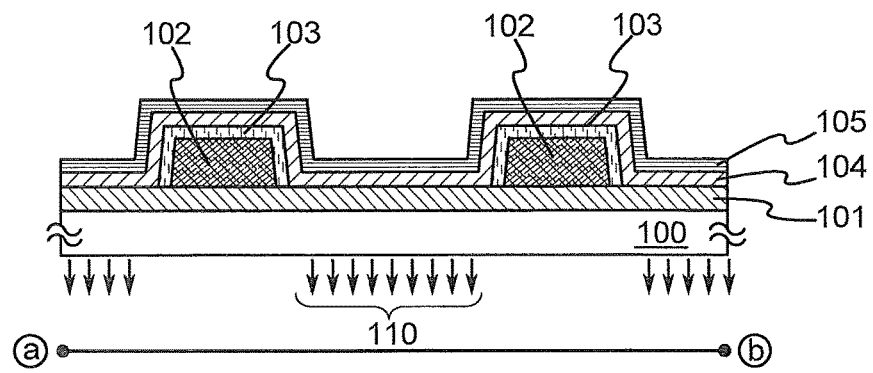
FIGS. 1A and 1B are views illustrating a light-emitting device which is one embodiment of the present invention.
Figure 1B:
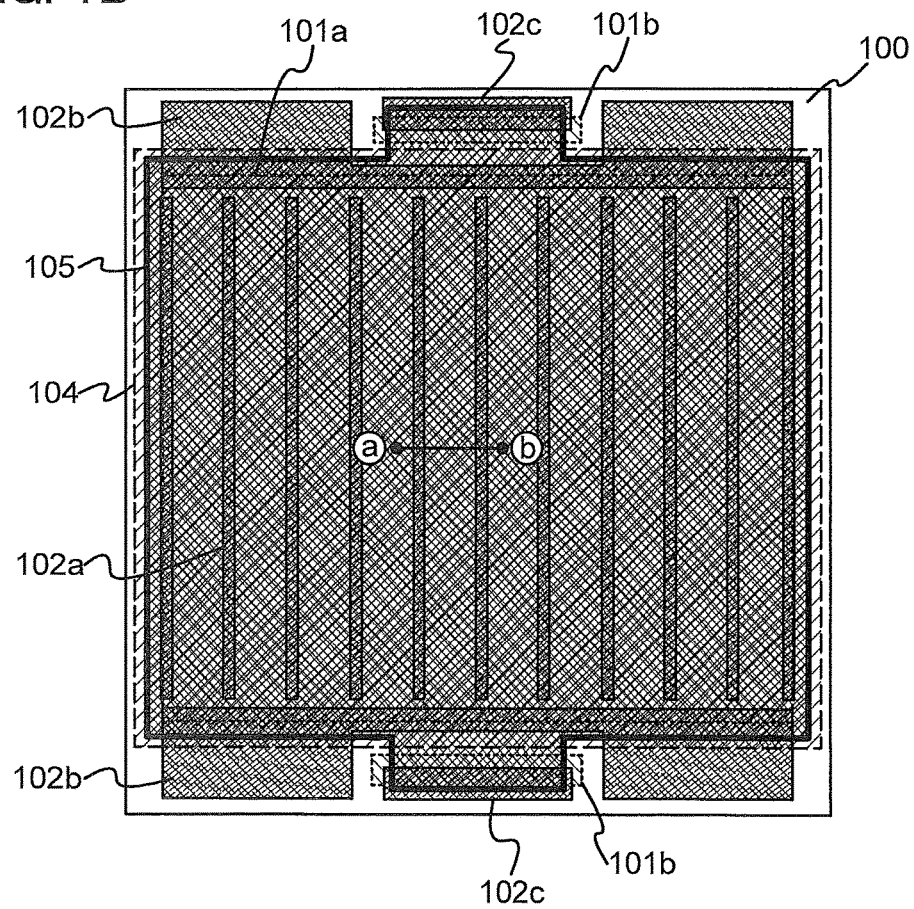

FIGS. 1A and 1B are a schematic cross-sectional view and a schematic top view illustrating a lighting device which is one embodiment of the present invention. FIG. 1A is an enlarged view of a cross section taken along line a-b in FIG. 1B. Note that for easy understanding, the magnification ratio and the reduction ratio of each component in drawings is not constant, and thus the relationship of thickness, length, and size of each component in the drawings does not necessarily show the ratios of thickness, length, and size of a lighting device of one embodiment of the present invention.

The cross-sectional view of FIG. 1A is described. FIG. 1A is a cross-sectional view taken along line a-b in the top view of FIG. 1B. As a substrate 100, a substrate formed using a component that transmits at least a wavelength of light emitted from an EL layer 104. Specifically, a glass substrate, a quartz substrate, or a substrate or film formed using an organic resin can be used. Examples of the organic resin include an acrylic resin, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. Such a substrate or film used as the substrate 100 may be provided with a protection film or a member for reinforcement.

A first electrode 101 formed using a transparent conductive film is formed over the substrate 100. As the transparent conductive film, indium oxide ($In_2O_3$), an indium oxide-tin oxide alloy ($In_2O_3$—$SnO_2$: also referred to as ITO), an indium oxide-zinc oxide alloy ($In_2O_3$—ZnO), zinc oxide (ZnO), zinc oxide to which gallium is added, or the like can be used. Films of these conductive metal oxides are usually formed by sputtering; however, a sol-gel method or the like may also be used. Alternatively, as the first electrode 101, a thin film formed using gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (e.g., titanium nitride), or the like to have a sufficient light-transmitting property can be used as the transparent conductive film.

Note that the above-described materials are materials having a high work function (specifically 4.0 eV or more)

and preferably used in the case where the first electrode 101 is an anode. In the case where the first electrode 101 is a cathode, a material having a low work function (specifically 3.8 eV or less), specifically a metal element belonging to Group 1 or 2 of the periodic table, that is, an alkali metal such as lithium (Li) or cesium (Cs), an alkaline earth metal such as magnesium (Mg), calcium (Ca), or strontium (Sr), or an alloy containing any of these elements (e.g., MgAg or AlLi), a rare earth metal such as europium (Eu) or ytterbium (Yb), an alloy containing any of these elements, aluminum (Al), or an alloy containing aluminum can be used. A thin film formed using any of these materials to have a sufficient light-transmitting property as the transparent conductive film can also be used as the first electrode 101.

Alternatively, a conductive high polymer can be used for the first electrode 101. For example, as the conductive high polymer, a π-electron conjugated conductive high polymer such as polyaniline or a derivative thereof, polypyrrole or a derivative thereof, polythiophene or a derivative thereof, or a copolymer of two or more kinds of these materials can be used.

Note that as in FIG. 1B, a power supply pad 101b may be formed simultaneously with formation of a first electrode 101a. FIG. 1B shows an example where the first electrode 101a forms an island shape, which is one favorable example in terms of light-emitting area or suppression of voltage drop. The first electrode 101a may be separated into a plurality of island-shaped electrodes depending on the purpose or convenience.

An auxiliary electrode 102 is formed over the first electrode 101. A surface of the auxiliary electrode 102 other than the surface in contact with the first electrode 101 is covered with an oxide layer 103 having an insulating property which is oxide of a material used for the auxiliary electrode 102. As the material for the auxiliary electrode 102, a metal material or an alloy material whose resistivity is low and whose oxide is an insulator or has high resistivity can be used. As such a material, aluminum, an alkaline earth metal, or an alloy containing either aluminum or an alkaline earth metal can be used. The thickness and width of the auxiliary electrode and the interval between the auxiliary electrodes may be determined in view of variation in emission luminance of a light-emitting element which is attributed to voltage drop due to the first electrode 101.

The transparent conductive film used as the first electrode 101 has higher resistivity than a film formed using a conductive metal. Further, when a thickness of the transparent conductive film is thin enough to have a light-transmitting property, a resistance of the transparent conductive film is also high. Therefore, in the case of using the transparent conductive film for a large-area light-emitting device that is used for a lighting purpose or the like, there is a problem in that the emission luminance in a light-emitting region is varied due to voltage drop. However, since the formation of the auxiliary electrode 102 can suppress the voltage drop, uniform light emission can be obtained.

Although the auxiliary electrode 102 can be formed by an existing method such as photolithography, the auxiliary electrode 102 is preferably patterned by being formed using a shadow mask. Accordingly, the auxiliary electrode 102 can be formed without photolithography and complicated steps accompanying the photolithography such as etching and cleaning, which leads to cost reduction. Further, the oxide layer 103 having an insulating property is formed by oxidizing a surface of the auxiliary electrode 102 after the formation of the auxiliary electrode 102. Therefore, precise alignment is not needed to form the oxide layer 103, so that capital-investment spending for quantity production can be reduced. Furthermore, the oxide layer 103 having an insulating property covers an end or a side surface of the auxiliary electrode 102 in addition to a top surface of the auxiliary electrode 102. Therefore, light emission not only from the top surface but also from the end or the side surface of the auxiliary electrode 102 can be suppressed, so that decrease in power efficiency can be suppressed. Moreover, since the end or the side surface of the auxiliary electrode 102 is covered with the oxide layer 103 having an insulating property, short circuit between the auxiliary electrode 102 and a second electrode 105 can be prevented even when the EL layer 104 cannot cover a step due to the auxiliary electrode 102, so that the reliability of the light-emitting device is improved.

In the above-described structure of the light-emitting device in this embodiment which is one embodiment of the present invention, light emission is obtained only in a region 110 where three layers, that is, the first electrode 101, the EL layer 104, and the second electrode 105 overlap with each other, so that light emission that cannot be extracted is small and thus power loss is reduced, whereby the light-emitting device in which decrease in power efficiency can be suppressed can be provided.

As illustrated in FIG. 1B, auxiliary electrode 102a may have a shape of stripes. Alternatively, the auxiliary electrode 102a may have various shapes such as a zigzag shape, a meander shape, an S-like shape, or a fishbone shape depending on a pattern of a shadow mask. A power supply pad 102b and a power supply pad 102c may be formed simultaneously with the formation of the auxiliary electrode 102a is formed.

The EL layer 104 is formed to cover the first electrode 101, the auxiliary electrode 102, and the oxide layer 103. There is no particular limitation on the stacked-layer structure of the EL layer 104. The EL layer 104 may be formed by combining functional layers as appropriate, such as a light-emitting layer, an electron-transport layer containing a substance having a high electron-transport property, a hole-transport layer containing a substance having a high hole-transport property, an electron-injection layer containing a substance having a high electron-injection property, a hole-injection layer containing a substance having a high hole-injection property, and a bipolar layer containing a substance having a bipolar property (a substance having a high electron-transport property and a high hole-transport property). These functional layers other than the light-emitting layer are not necessarily provided and another functional layer may be provided. Note that such a stacked-layer structure is referred to as a light-emitting unit in some cases.

Figure 2:
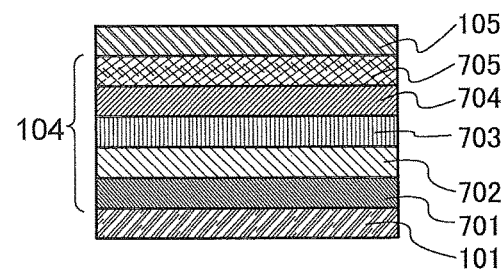
FIG. 2 is a view illustrating a structural example of an EL layer applicable to the present invention.

In this embodiment, a structure of the EL layer 104, which includes a hole-injection layer 701, a hole-transport layer 702, a light-emitting layer 703, an electron-transport layer 704, and an electron-injection layer 705, is described (see FIG. 2). A structure and material of each layer is specifically described below.

The hole-injection layer 701 is a layer which is provided in contact with an anode and contains a substance having a high hole-injection property. The hole-injection layer 701 can be formed using molybdenum oxide, vanadium oxide, ruthenium oxide, tungsten oxide, manganese oxide, or the like. Alternatively, the hole-injection layer 701 can be formed using a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis[4-[bis (3-methylphenyl)amino]phenyl]-N,N'-diphenyl-[1,1'-biphenyl]-4,4'-diamine (abbreviation: DNTPD); a high molecule such as poly(ethylenedioxythiophene)/poly(styrenesulfonic acid) (PEDOT/PSS); or the like.

Alternatively, the hole-injection layer 701 can be formed using a composite material in which an acceptor substance is contained in a substance having a high hole-transport property. Note that when the composite material in which an acceptor substance is contained in a substance having a high hole-transport property is used, a material for forming the electrode can be selected regardless of its work function. In other words, besides a material with a high work function, a material with a low work function may also be used for the anode. As the acceptor substance, 7,7,8,8-tetracyano-2,3,5,6-tetrafluoroquinodimethane (abbreviation: $F_4$-TCNQ), chloranil, and the like are given. In addition, a transition metal oxide is given. Moreover, oxides of metals that belong to Group 4 to Group 8 of the periodic table are given. Specifically, vanadium oxide, niobium oxide, tantalum oxide, chromium oxide, molybdenum oxide, tungsten oxide, manganese oxide, and rhenium oxide are preferable since their electron-accepting property is high. In particular, molybdenum oxide is particularly preferable because of its stability in the atmosphere, a low hygroscopic property, and easiness in handling.

As the substance having a high hole-transport property used for the composite material, any of a variety of compounds such as an aromatic amine compound, a carbazole derivative, an aromatic hydrocarbon, and a high molecular compound (e.g., an oligomer, a dendrimer, or a polymer) can be used. The organic compound used for the composite material is preferably an organic compound having a high hole-transport property. Specifically, a substance having a hole mobility of $10^{-6}$ cm$^2$/Vs or higher is preferably used. However, another substance may be used instead of the above described materials as long as the substance has a hole-transport property higher than an electron-transport property. The organic compounds that can be used for the composite material are specifically given below.

As the aromatic amine compounds, for example, there are N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), and 1,3,5-tris[N-(4-diphenylaminophenyl)-N-phenylamino]benzene (abbreviation: DPA3B).

As the carbazole derivatives which can be used for the composite material, the followings are given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Other examples of the carbazole derivatives which can be used for the composite material include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon which can be used for the composite material include 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides those, pentacene, coronene, or the like can be used. In particular, the aromatic hydrocarbon which has a hole mobility of $1\times10^{-6}$ cm$^2$/Vs or higher and which has 14 to 42 carbon atoms is particularly preferable.

The aromatic hydrocarbon which can be used for the composite material may have a vinyl skeleton. As the aromatic hydrocarbon having a vinyl group, 4,4'-bis(2,2-diphenylvinyl)biphenyl (abbreviation: DPVBi) and 9,10-bis[4-(2,2-diphenylvinyl)phenyl]anthracene (abbreviation: DPVPA) are given, for example.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), or poly[N,N'-bis(4-butylphenyl)-N,N'-bis(phenyl)benzidine (abbreviation: Poly-TPD) can also be used.

A layer formed using such a composite material can be very suitably used for optical design that is performed to control the light-extraction efficiency, directivity, or the like of light emitted from the light-emitting layer because the layer formed using the composite material hardly increases driving voltage even when the layer is formed to be thick.

Note that in the case where the hole-injection layer 701 is formed using a composite material, a material for an electrode can be selected regardless of its work function, as described above. In the case where the first electrode 101 is an anode, the composite material is used for the hole-injection layer 701, and the oxide layer 103 is not formed, holes are injected from the hole-injection layer to the hole-transport layer and the light-emitting layer even when the auxiliary electrode 102 is formed using a material having a low work function, and light emission occurs between the auxiliary electrode 102 and the second electrode 105. This light emission is blocked by the auxiliary electrode 102 and cannot be extracted, leading to decrease in power efficiency. However, according to this embodiment, the oxide layer 103 having an insulating property is formed by oxidizing the auxiliary electrode 102, so that wasted light emission does not occur and thus the decrease in power efficiency can be suppressed. Therefore, the structure of this embodiment is useful particularly in the case where the composite material is used for the hole-injection layer 701.

The hole-transport layer 702 is a layer which contains a substance having a high hole-transport property. Examples of the substance having a high hole-transport property include aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like. The substances mentioned here are mainly ones that have a hole mobility of $10^{-6}$ cm$^2$/Vs or higher. Note that another substance may be used instead of these substances as long as the substance has a hole-transport property higher than an electron-transport property. The layer containing a substance having a high hole-transport property is not limited to a single layer, and may be a stack of two or more layers containing the substances given above.

Alternatively, a high molecular compound such as poly (N-vinylcarbazole) (abbreviation: PVK) or poly(4-vinyltriphenylamine) (abbreviation: PVTPA) can be used for the hole-transport layer 702.

The light-emitting layer 703 is a layer which contains a light-emitting substance. The light-emitting layer 703 may be either a light-emitting layer of a single film containing an emission center material as its main component or a so-called host-guest type light-emitting layer in which an emission center material is dispersed in a host material.

There is no particular limitation on the emission center material that is used, and a known fluorescent material or a known phosphorescent material can be used. As a fluorescent material, for example, in addition to N,N'-bis[4-(9H-carbazol-9-yl)phenyl]-N,N'-diphenylstilbene-4,4'-diamine (abbreviation: YGA2S), and 4-(9H-carbazol-9-yl)-4'-(10-phenyl-9-anthryl)triphenylamine (abbreviation: YGAPA), there are fluorescent materials with an emission wavelength of greater than or equal to 450 nm, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl) phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). As phosphorescent materials, for example, in addition to bis[2-(4',6'-difluorophenyl)pyridinato-N,$C^{2'}$]iridium(III)tetrakis (1-pyrazolyl)borate (abbreviation: FIr6), there are phosphorescent materials with an emission wavelength in the range of 470 nm to 500 nm, such as bis[2-(4',6'-difluorophenyl) pyridinato-N,$C^{2'}$]iridium(III)picolinate (abbreviation: FIrpic), bis[2-(3',5'-bistrifluoromethylphenyl)pyridinato-N,$C^{2'}$]iridium(III)picolinate (abbreviation: Ir(CF$_3$ppy)$_2$(pic)), and bis[2-(4',6'-difluorophenyl)pyridinato-N,$C^{2'}$]iridium (III)acetylacetonate (abbreviation: FIracac); phosphorescent materials with an emission wavelength of greater than or equal to 500 nm (materials which emit green light), such as tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), tris(acetylacetonato) (monophenanthroline)terbium(III) (abbreviation: Tb(acac)$_3$ (Phen)), bis(benzo[h]quinolinato)iridium(III) acetylacetonate (abbreviation: Ir(bzq)$_2$(acac)), bis(2,4-diphenyl-1,3-oxazolato-N,$C^{2'}$)iridium(III)acetylacetonate (abbreviation: Ir(dpo)$_2$(acac)), bis[2-(4'-perfluorophenyl-phenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), bis[2-(2'-benzo[4,5-a]thienyl)pyridinato-N,$C^{3'}$]iridium(III) acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (2,3,7,8,12,13,17,18-octaethyl-21H,23H-porphine)platinum (II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)); and the like. The light-emitting substances can be selected from the above-mentioned materials or other known materials in consideration of the emission color of each of the light-emitting elements.

When the host material is used, for example, the following are given: metal complexes such as tris(8-quinolinolato) aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1, 3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compounds include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 3,3',3''-(benzene-1,3,5-triyl)tripyrene (abbreviation: TPB3). From these materials or other known materials, a material may be selected which has a larger energy gap (or a triplet energy if the material emits phosphorescence) than an emission center material dispersed in the material and which has a transport property as needed.

The electron-transport layer 704 is a layer which contains a substance having a high electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq) is used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/Vs or higher. Note that another substance may be used for the electron-transport layer 704 as long as the substance has a higher electron-transport property than a hole-transport property.

Further, the electron-transport layer 704 is not limited to a single layer and may be a stack of two or more layers containing the substances given above.

Further, a layer for controlling transport of electron carriers may be provided between the electron-transport layer 704 and the light-emitting layer 703. Specifically, the layer for controlling transport of electron carriers is a layer formed by adding a small amount of substance having a high electron trapping property to the above-described material having a high electron-transport property, and can adjust carrier balance by suppressing transport of electron carriers. Such a structure is very effective in suppressing problems (e.g., reduction in element lifetime) caused by a phenomenon in which an electron passes through the light-emitting layer 703.

For the electron-injection layer 705, an alkali metal, an alkaline earth metal, or a compound thereof, such as lithium fluoride (LiF), cesium fluoride (CsF), or calcium fluoride (CaF$_2$), can be used. For example, a layer in which an alkali metal, an alkaline earth metal, or a compound thereof is contained in a substance having an electron-transport property, for example, a layer in which magnesium (Mg) is contained in Alq can be used. Note that by using a layer in which an alkali metal or an alkaline earth metal is contained in a substance having an electron-transport property as the electron-injection layer 705, electrons are injected efficiently from the second electrode 105, which is preferable.

In the case of using the second electrode 105 as a cathode, metal, an alloy, an electrically conductive compound, a mixture thereof, or the like having a low work function (specifically, 3.8 eV or lower) can be used as a substance for the second electrode 105. As a specific example of such a cathode material, an element belonging to Group 1 or 2 of the periodic table, that is, an alkali metal such as lithium (Li) or cesium (Cs); an alkaline earth metal such as magnesium (Mg), calcium (Ca), or strontium (Sr); an alloy containing any of these (e.g., MgAg or AlLi); a rare earth metal such as europium (Eu) or ytterbium (Yb); an alloy containing such a rare earth metal; and the like are given. Note that when the electron-injection layer 705 is provided between the cathode and the electron-transport layer 704, the cathode can be formed using a variety of conductive materials such as Al, Ag, ITO, or indium oxide-tin oxide containing silicon or silicon oxide, regardless of its work function. These conductive materials can be deposited by a sputtering method, a vacuum evaporation method, or the like.

In the case of using the second electrode 105 as an anode, metal, an alloy, a conductive compound, a mixture thereof, or the like having a high work function (specifically, 4.0 eV or higher) is preferably used. Specifically, for example, indium tin oxide (ITO), indium tin oxide containing silicon or silicon oxide, indium zinc oxide (IZO), indium oxide containing tungsten oxide and zinc oxide (IWZO), or the like is given. Films of these conductive metal oxides are usually formed by sputtering; however, a sol-gel method or the like may also be used. For example, indium zinc oxide (IZO) can be formed by a sputtering method using a target in which zinc oxide is added to indium oxide at 1 wt % to 20 wt %. Moreover, indium oxide containing tungsten oxide and zinc oxide (IWZO) can be formed by a sputtering method using a target in which tungsten oxide is added to indium oxide at 0.5 wt % to 5 wt % and zinc oxide is added to indium oxide at 0.1 wt % to 1 wt %. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like is given. When the above-mentioned composite material is formed to be in contact with the anode, a material for the electrode can be selected regardless of its work function.

Figure 3:
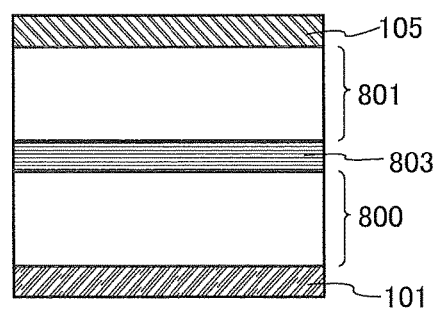
FIG. 3 is a view illustrating a structural example of an EL layer applicable to the present invention.

Note that the EL layer 104 may have a structure in which a plurality of light-emitting units each including at least the light-emitting layer 703 is stacked between the first electrode 101 and the second electrode 105 as illustrated in FIG. 3. In that case, a charge-generation layer 803 is preferably provided between a first light-emitting unit 800 and a second light-emitting unit 801 which are stacked. The charge-generation layer 803 can be formed using the above-mentioned composite material. Further, the charge-generation layer 803 may have a stacked structure of a layer formed using the composite material and a layer formed using another material. In that case, as the layer formed using another material, a layer containing an electron donating substance and a substance having a high electron-transport property, a layer formed of a transparent conductive film, or the like can be used. A light-emitting element having such a structure does not easily involve problems such as energy transfer between the light-emitting units and quenching and has more choices of materials, thereby readily having both high light emission efficiency and a long lifetime. It is also easy for such a light-emitting element to exhibit phosphorescence from one of the light-emitting units and fluorescence from the other of the light-emitting units. The light-emitting unit may be formed by combining functional layers as appropriate, such as a light-emitting layer, an electron-transport layer containing a substance having a high electron-transport property, a hole-transport layer containing a substance having a high hole-transport property, an electron-injection layer containing a substance having a high electron-injection property, a hole-injection layer containing a substance having a high hole-injection property, and a bipolar layer containing a substance having a bipolar property (a substance having a high electron-transport property and a high hole-transport property). These functional layers other than the light-emitting layer are not necessarily provided and another functional layer may be provided. The detailed explanation of these layers is given above and a repeated explanation is omitted.

The structure illustrated in FIG. 3 is particularly preferable for obtaining white light emission. A high-quality light-emitting device and a high-quality lighting device can be obtained by combining the structures illustrated in FIGS. 1A and 1B and FIG. 2 with the structure illustrated in FIG. 3.

Next, a method for manufacturing the light-emitting device and the lighting device is described with reference to FIGS. 4A1 to 4E2. Note that a material, a structure, and a detailed manufacturing method are given above; thus, a repeated description is omitted.

A transparent conductive film is formed as the first electrode 101 over the substrate 100 (FIGS. 4A1 and 4A2). Although an evaporation method, a sputtering method, a wet method, or the like can be selected depending on a material of the transparent conductive film, a sputtering method or evaporation method using a shadow mask is simple and thus preferable. In the case where a pattern of the transparent conductive film is formed after the formation of the transparent conductive film, a photolithography method or the like may be performed. Note that as in FIG. 4A2, the power supply pad 101*b* may be formed simultaneously with the formation of the first electrode 101*a*.

Next, a material such as aluminum, an alkaline earth metal, or an alloy thereof is deposited over the first electrode 101 using a shadow mask 120 by an evaporation method, a sputtering method, or the like, so that the auxiliary electrode 102 is formed (FIG. 4B). Then, the surface of the auxiliary electrode 102 is oxidized so that the oxide layer 103 having an insulating property is formed (FIG. 4C1). As the method for oxidizing the surface of the auxiliary electrode, there are a method in which the surface is exposed to oxygen plasma, a method in which the surface is exposed to ozone water, a method in which the surface is heated in an atmosphere containing oxygen, a method in which the surface is heated in an atmosphere containing oxygen and irradiated with ultraviolet light, a method in which the surface is stored in the atmosphere, a method in which the surface is exposed to an oxygen flow in vacuum, and the like. In particular, the method in which the surface is exposed to oxygen plasma is preferable because a surface of the first electrode 101 can also be cleaned. Note that a power supply pad may be formed simultaneously with the formation of the auxiliary electrode 102*a*. The power supply pad may be formed to have the shape of the power supply pad 102*b* or the power supply pad 102*c* in FIG. 4C2, for example. The power supply pad 102*b* is formed to overlap with and is electrically connected to the first electrode 101*a*. The power supply pad 102*c* is formed to overlap with and is electrically connected to the power supply pad 101*b* that is formed earlier than the power supply pad 102*c*.

In such a manner, the auxiliary electrode 102 is formed using the shadow mask 120, whereby the auxiliary electrode 102 can be formed without photolithography and complicated steps accompanying the photolithography such as etching and cleaning, which leads to cost reduction. Further, since the oxide layer 103 having an insulating property is formed by oxidizing the surface of the auxiliary electrode 102 after the formation of the auxiliary electrode 102, precise alignment for forming the oxide layer 103 is not needed, so that capital-investment spending for quantity production can be reduced. Furthermore, the oxide layer 103 having an insulating property covers the end or the side surface of the auxiliary electrode 102 in addition to the top surface of the auxiliary electrode 102; thus, light emission not only from the top surface but also from the end or the side surface of the auxiliary electrode 102 can be suppressed, so that decrease in power efficiency can be suppressed. Moreover, since the end or the side surface of the auxiliary electrode 102 is covered with the oxide layer 103 having an insulating property, short circuit between the auxiliary electrode 102 and the second electrode 105 can be prevented even when the EL layer 104 cannot cover a step due to the auxiliary electrode 102, so that the reliability of the light-emitting device is improved.

After that, the EL layer 104 is formed to cover the first electrode 101, the auxiliary electrode 102, and the oxide layer 103 (FIGS. 4D1 and 4D2). The EL layer 104 may be formed by a known method such as an evaporation method or a wet method. The EL layer 104 is formed slightly larger than the first electrode 101*a* as in FIG. 4D2 so that short circuit between the first electrode 101 and the second electrode 105 can be prevented even when the second electrode 105 is formed with a little misalignment in a later step; thus, the reliability of the light-emitting device is improved.

Then, the second electrode 105 is formed to cover the EL layer 104. The second electrode 105 may be formed by a known method such as an evaporation method or a sputtering method. Note that the second electrode 105 is formed to have a shape illustrated in FIGS. 4E1 and E2 and may be electrically connected to the power supply pad 101*b* and the power supply pad 102*c*.

Finally, a sealing substrate is bonded to the substrate 100 (also referred to as an element substrate) provided with the first electrode 101, the auxiliary electrode 102 (the oxide layer 103), the EL layer 104, the second electrode 105, the power supply pad, and the like using a sealing material, whereby the light-emitting device which is one embodiment of the present invention can be obtained. Note that a space formed between the element substrate, the sealing material, and the sealing substrate is filled with filler. An inert gas (e.g., nitrogen or argon), an epoxy-based resin, or the like is used as the filler. As the sealing substrate, a substrate that does not transmit a wavelength of light emitted from the EL layer 104, such as a ceramic substrate or a metal substrate, can be used in addition to a member similar to the substrate 100.

Figure 6:
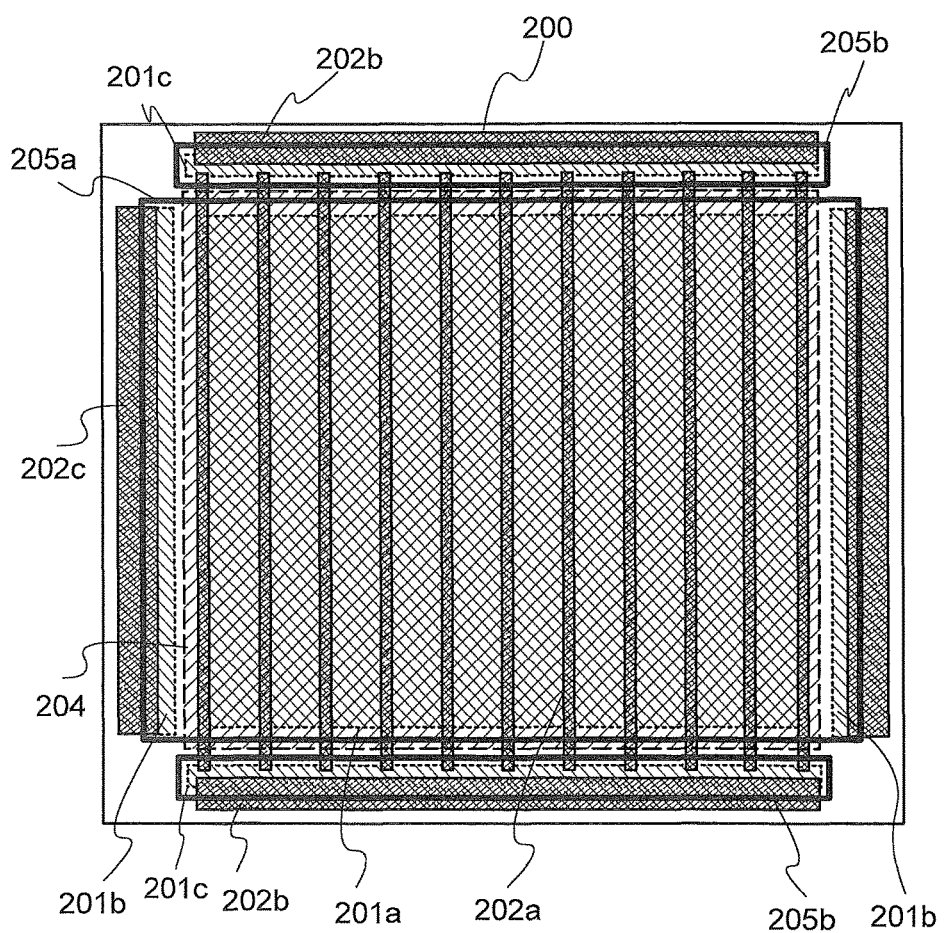
FIG. 6 is a view illustrating a light-emitting device which is one embodiment of the present invention.

FIG. 6 illustrates a layout of a light-emitting device having a structure which is different from the structure illustrated in FIG. 1B. The layout in FIG. 6 and the layout in FIG. 1B can be formed using a mask without a photolithography process. The film formation using a mask imposes many restrictions on layout because a region where a film is not formed cannot be surrounded by a region where a film is formed; however, by employing the layout as in FIG. 1B or FIG. 6, the light-emitting device which is one embodiment of the present invention can be manufactured simply by film formation using a mask.

FIG. 1B is described in detail. In FIG. 1B, a transparent conductive film is formed over the substrate 100 as the first electrode 101a. At this time (using the same mask), the power supply pad 102c is formed. Next, the auxiliary electrode 102a is formed to have a shape of stripes over the first electrode 101a. Note that the shape of the auxiliary electrode is not limited to the shape of stripes. Simultaneously with the formation of the auxiliary electrode 102a (using the same mask), the power supply pad 102b serving as both a wiring for applying voltage to the first electrode 101a and a power supply pad is formed. The power supply pad 102b is formed to cover the power supply pad side of the first electrode 101a, and thus voltage is uniformly applied at the side of the first electrode 101a. Since the auxiliary electrode 102a and the power supply pad 102b are formed simultaneously (using the same mask), a region where a film is not formed cannot be surrounded by a region where a film is formed, as described above; thus, space is provided as appropriate between the auxiliary electrode 102a and the power supply pad 102b as in FIG. 1B. Note that, as long as a region where a film is not formed is not surrounded by a region where a film is formed, the auxiliary electrode 102a may alternately be in contact with the power supply pad 102b in the upper portion and the power supply pad 102b in the lower portion so that a shape in which teeth of two combs are engaged with each other is formed. Simultaneously with the formation of the auxiliary electrode 102a and the power supply pad 102b, the power supply pad 102c may be formed to overlap with the power supply pad 101b that is formed earlier than the power supply pad 102c. After that, the EL layer 104 is formed. The EL layer 104 is formed larger than the first electrode 101a so that short circuit between the first electrode 101 and the second electrode 105 can be prevented even when the second electrode 105 is formed with a little misalignment in a later step; thus, the reliability of the light-emitting device is improved. After the formation of the EL layer, the second electrode 105 is formed. A projecting portion of the second electrode 105 overlaps with the power supply pad 101b and the power supply pad 102c so that voltage is supplied.

Next, FIG. 6 is described in detail. In FIG. 6, a transparent conductive film is formed over a substrate 200 as a first electrode 201a. At this time (using the same mask), a cathode side power supply pad 201b and an anode side power supply pad 201c are formed. Then, auxiliary electrode 202a is formed over the first electrode 201a. Although the auxiliary electrode 202a illustrated in FIG. 6 has a shape of stripes, the shape of the auxiliary electrode 202a is not limited to the shape of stripes, as described for the auxiliary electrode 102a in FIG. 1B. The auxiliary electrode 202a is formed across the first electrode 201a and further extends to overlap with the anode side power supply pad 201c, which is different from the auxiliary electrode 102a in FIG. 1B.

Thus, voltage is supplied to the first electrode 201a through the auxiliary electrode 202a. In the structure of FIGS. 1A and 1B, since voltage is supplied by the power supply pad 102b, there is space between the power supply pad 102b and the auxiliary electrode 102a and there is only the first electrode 101a that is a transparent conductive film in the space; therefore, the light-emitting device having the structure illustrated in FIGS. 1A and 1B may be adversely affected by comparatively high resistance of the transparent conductive film in some degree. On the other hand, the light-emitting device illustrated in FIG. 6 is hardly adversely affected due to voltage drop because voltage is supplied through the auxiliary electrode 202a. Note that in FIG. 6, simultaneously with the formation of the auxiliary electrode 202a (using the same mask), an anode side power supply pad 202b partly overlapping with the anode side power supply pad 201c and a cathode side power supply pad 202c partly overlapping with the cathode side power supply pad 201b are formed. After that, the EL layer 204 is formed to cover at least the first electrode 201a, and then a second electrode 205a is formed. In order to prevent short circuit in a portion of the second electrode 205a where the first electrode 201a is formed, the second electrode 205a is formed to overlap with the EL layer 204. The second electrode 205a extends to the side on which the cathode side power supply pads 201b and 202c are provided and overlaps with the cathode side power supply pads 201b and 202c, so that voltage is supplied. Further, a wiring 205b for connecting the anode side power supply pads 201c and 202b with the auxiliary electrode 202a is formed simultaneously with the formation of the second electrode 205a (using the same mask). Thus, voltage can be supplied to the anode without being adversely affected by voltage drop due to the anode side power supply pad 201c that is formed using a transparent conductive film.

According to the above-described structure of the light-emitting device or the lighting device, the formation of all components from the first electrode to the second electrode can be conducted using a shadow mask. A light-emitting device or a lighting device can be obtained without a complicated photolithography process, which leads to cost reduction; thus, a light-emitting device or a lighting device can be manufactured at lower cost.

Embodiment 2

In this embodiment, a lighting device in which a light-emitting device manufactured according to one embodiment of the present invention is used is described with reference to FIGS. 5A and 5B.

Figure 5A:
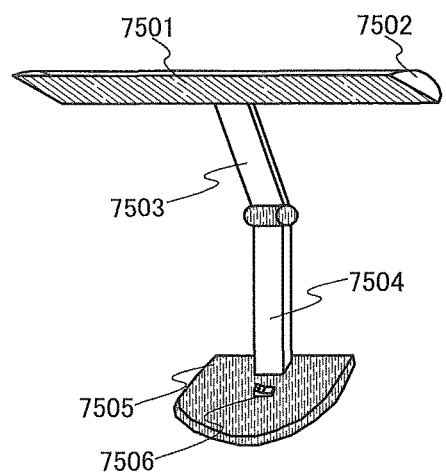
FIGS. 5A and 5B are views each illustrating a lighting device which is one embodiment of the present invention.

FIG. 5A illustrates a lighting device (a desk lamp), which includes a lighting portion 7501, a shade 7502, an adjustable arm 7503, a support 7504, a base 7505, and a power switch 7506. Note that the lighting device is manufactured by using a light-emitting device, which is manufactured according to one embodiment of the present invention, for the lighting portion 7501. The lighting device includes, in its category, ceiling lights (ceiling-fixed lighting devices), wall lights (wall-hanging lighting devices), and the like in addition to the desk lamp illustrated in FIG. 5A.

Note that a light-emitting device manufactured according to one embodiment of the present invention is a light-emitting device with low capital-investment spending for quantity production, in which short circuit due to a step of an auxiliary electrode is suppressed, power loss is reduced, and luminance in a light-emitting region is uniform. Therefore, by using the light-emitting device for the lighting portion 7501 in the lighting device (the desk lamp), the lighting device (the desk lamp) with high reliability, less power consumption, and high quality can be provided inexpensively.

Figure 5B:
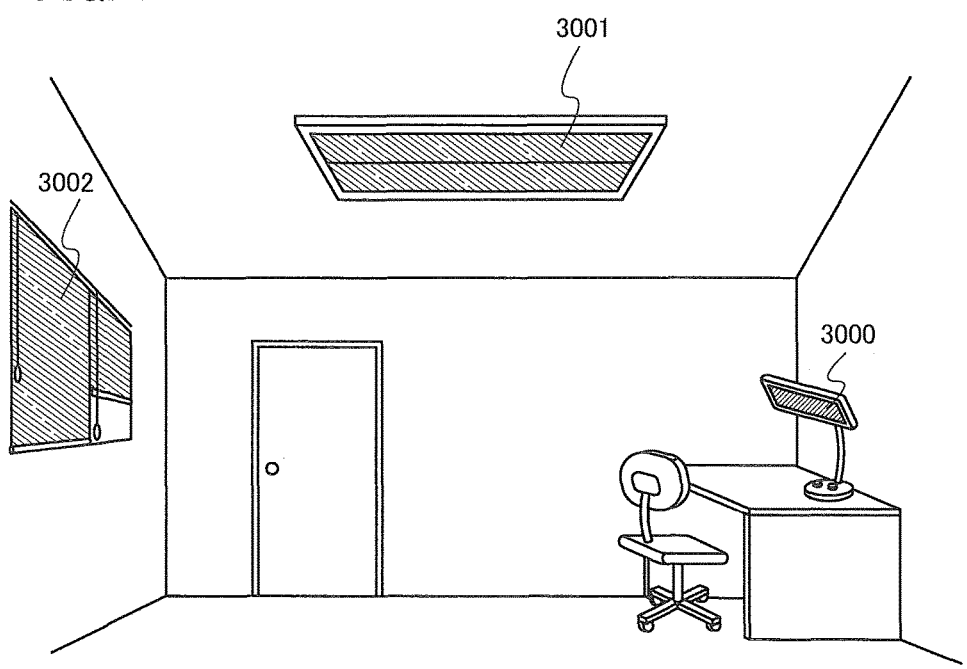

FIG. 5B illustrates an example in which a light-emitting device manufactured according to one embodiment of the present invention is used for an interior lighting device. The light-emitting device which is one embodiment of the present invention is advantageous in increasing the area because it includes an auxiliary electrode, and thus can be used for a lighting device having a large area like a ceiling-fixed lighting device 3001. In addition, the light-emitting device can be used for a wall-hanging lighting device 3002. Note that a light-emitting device manufactured according to one embodiment of the present invention is a light-emitting device with low capital-investment spending for quantity production, in which short circuit due to a step of an auxiliary electrode is suppressed, power loss is reduced, and luminance in a light-emitting region is uniform. Therefore, the lighting device with high reliability, less power consumption, and high quality can be provided inexpensively. As illustrated in FIG. 5B, the desk lamp illustrated in FIG. 5A may also be used in a room provided with the interior lighting device.

EXPLANATION OF REFERENCE

100: substrate, 101: first electrode, 101a: first electrode, 101b: power supply pad, 102: auxiliary electrode, 102a: auxiliary electrode, 102b: power supply pad, 102c: power supply pad, 103: oxide layer, 104: EL layer, 105: second electrode, 110: portion, 120: shadow mask, 200: substrate, 201a: first electrode, 201b: cathode side power supply pad, 201c: anode side power supply pad, 202a: auxiliary electrode, 202b: anode side power supply pad, 202c: cathode side power supply pad, 204: EL layer, 205a: second electrode, 205b: wiring, 701: hole-injection layer, 702: hole-transport layer, 703: light-emitting layer, 704: electron-transport layer, 705: electron-injection layer, 800: first light-emitting unit, 801: second light-emitting unit, 803: charge-generation layer, 3000: desk lamp, 3001: ceiling-fixed lighting device, 3002: wall-hanging lighting device, 7501: lighting portion, 7502: shade, 7503: adjustable arm, 7504: support, 7505: base, 7506: power switch This application is based on Japanese Patent Application serial no. 2010-167282 filed with Japan Patent Office on Jul. 26, 2010, the entire contents of which are hereby incorporated by reference.

What is claimed is:

1. A light-emitting device comprising:
a first pad over a substrate;
a second pad over the substrate;
a first electrode between the first pad and the second pad, the first electrode having a light-transmitting property;
an auxiliary electrode over and in direct contact with the first pad, the second pad and the first electrode;
a third pad over the first pad;
a fourth pad over the second pad;
an EL layer over the first electrode and the auxiliary electrode; and
a second electrode over the EL layer, the second electrode being electrically connected to the first pad and the second pad via the EL layer, the first electrode and the auxiliary electrode, the second electrode being electrically connected to the third pad and the fourth pad.

2. The light-emitting device according to claim 1, wherein the auxiliary electrode includes aluminum or an alkaline earth metal.

3. The light-emitting device according to claim 1, wherein the first electrode is a transparent conductive layer.

4. A light-emitting device comprising:
a first pad over a substrate;
a second pad over the substrate;
a first electrode between the first pad and the second pad, the first electrode having a light-transmitting property;
an auxiliary electrode over and in direct contact with the first pad, the second pad and the first electrode, wherein a surface of the auxiliary electrode is oxidized so that an insulating layer is on the auxiliary electrode;
a third pad over the first pad;
a fourth pad over the second pad;
an EL layer over the first electrode and the insulating layer; and
a second electrode over the EL layer,
wherein the second electrode is electrically connected to the first pad and the second pad via the EL layer, the first electrode and the auxiliary electrode, and
wherein the second electrode is electrically connected to the third pad and the fourth pad.

5. The light-emitting device according to claim 4, wherein the auxiliary electrode includes aluminum or an alkaline earth metal.

6. The light-emitting device according to claim 4, wherein the first electrode is a transparent conductive layer.

7. The light-emitting device according to claim 4, wherein the insulating layer is essentially an oxide of a material included in the auxiliary electrode.

* * * * *